United States Patent [19]

Iyechika et al.

[11] Patent Number: 5,587,014
[45] Date of Patent: Dec. 24, 1996

[54] METHOD FOR MANUFACTURING GROUP III-V COMPOUND SEMICONDUCTOR CRYSTALS

[75] Inventors: Yasushi Iyechika; Tomoyuki Takada, both of Ibaraki, Japan

[73] Assignee: Sumitomo Chemical Company, Limited, Osaka, Japan

[21] Appl. No.: 360,427

[22] Filed: Dec. 21, 1994

[30] Foreign Application Priority Data

Dec. 22, 1993 [JP] Japan .................................. 5-325333

[51] Int. Cl.$^6$ ........................................................ G30B 25/14
[52] U.S. Cl. ................... 117/90; 117/94; 117/97; 117/106; 117/952
[58] Field of Search .............................. 117/952, 97, 94, 117/106, 90

[56] References Cited

U.S. PATENT DOCUMENTS

| | | | |
|---|---|---|---|
| 4,144,116 | 3/1979 | Jacob et al. | 117/952 |
| 4,473,938 | 10/1984 | Kobayashi et al. | 117/952 |
| 4,855,249 | 9/1989 | Akasaki et al. | 117/97 |
| 4,874,464 | 10/1989 | Goodwin et al. | 117/92 |
| 5,122,845 | 6/1992 | Manabe et al. | 117/97 |
| 5,290,393 | 3/1994 | Nakamura | 117/97 |
| 5,346,581 | 9/1994 | Tsang | 117/97 |

FOREIGN PATENT DOCUMENTS

| | | | |
|---|---|---|---|
| 225485 | 7/1985 | Germany | 117/952 |
| 62-119196 | 5/1987 | Japan | 117/952 |

OTHER PUBLICATIONS

H. Amano et al., *Appl. Phys. Lett.*, 48 (5), 3 Feb. 1986, pp. 353–355.

S. Yoshida et al., *Appl. Phys. Lett.*, 42 (5), 1 Mar. 1983, pp. 427–429.

A. Watanabe et al., *Journal of Crystal Growth*, 128 (1993) pp. 391–396.

S. Nakamura, *Japanese Journal of Applied Physics*, vol. 30, No. 10A, Oct., 1991, pp. L1705–L1707.

K. Naniwae et al., *Journal of Crystal Growth*, 99 (1990) pp. 381–384.

*Primary Examiner*—Robert Kunemund
*Attorney, Agent, or Firm*—Birch, Stewart, Kolasch & Birch, LLP

[57] ABSTRACT

There is provided a method for manufacturing group III-V compound semiconductors including at least Ga as the group III element and at least N as the group V element by using metal-organic compounds of group III elements having at least Ga in the molecules thereof and compounds having at least N in the molecules thereof as the raw materials, and the group III-V compound semiconductor crystals are grown in a reaction tube, and epitaxial layer of crystals are grown on a substrate made of a material different from that of the crystals to be grown, wherein at least one kind of gas, selected from a group consisting of compounds including halogen elements and group V elements and hydrogen halide, is introduced before the growth of the compound semiconductor crystal begins, thereby to carry out gas-phase etching of the inner wall surface of a reaction tube. Epitaxial crystals having good crystallinity and surface morphology can be obtained with good reproducibility without impairing the productivity and stability of the product property.

10 Claims, 1 Drawing Sheet

METHOD FOR MANUFACTURING GROUP III-V COMPOUND SEMICONDUCTOR CRYSTALS

The present invention relates to a method for manufacturing group III–V compound semiconductors including at least Ga as the group III element and at least N as the group V element, wherein a group III–V compound semiconductor or epitaxial layer of crystal is grown on a substrate made of a material different from that of the crystal to be grown.

In recent years, GaN, AlN, InN and gallium nitride compound semiconductors which are mixed crystals of the aforesaid materials have been receiving much attention as materials to make light emitting devices which emit over the spectrum from ultraviolet to visible light. As methods for growing a crystal of the gallium nitride compound semiconductor, the hydride vapor phase epitaxy (HVPE) method, the molecular beam epitaxy (MBE) method and the metal-organic chemical vapor deposition (MOCVD) method have been known.

A good crystal of gallium nitride compound semiconductor cannot be obtained through bulk growth, and on the other hand, it is also difficult to manufacture this crystal through homo-epitaxial growth on a substrate made of the same material. Thus hetero-epitaxial growth is preferable wherein the crystal is made to grow on a substrate made of a material different from that of the film to be grown. However, because few substrates have matching lattices, substrates having significant lattice mismatch are generally used such as α-alumina (13.8% lattice mismatch), silicon carbide (3.4% lattice mismatch), ZnO (2.0% lattice mismatch) and silicon (20.4% lattice mismatch).

It has been known that it is very difficult to obtain a single crystal having a large area through hetero-epitaxial growth, and many defects are likely to be formed. In general, when a semiconductor material is used for a light emitting device, crystal defects and impurities form non-emitting centers having adverse effects on the device characteristics such as light emitting efficiency. Therefore it is indispensable to minimize the crystal defects and impurities and improve the crystallinity in order to fabricate a light emitting device which employs the crystal.

Meanwhile, it has been reported that significant improvements of crystallinity have been achieved. In the case of the MOCVD method among the methods for growing crystal, through 2-step growth wherein an extremely thin AlN or GaN buffer layer is grown by low-temperature growth, bulk crystal is grown at a high temperature (U.S. Pat. No. 5,122,825; U.S. Pat. No. 4,855,249; U.S. Pat. No. 5,290,393).

Also a hydrogen cleaning process is used commonly for the pre-treatment of the α-alumina substrate, wherein the substrate temperature is increased to 1000° to 1200° C. in hydrogen atmosphere before the crystal growth begins, thereby eliminating the surface defects.

In gas-phase growth methods such as the HVPE method and the MOCVD method, crystal deposition occurs also on the wall of a reaction tube, a susceptor surface, etc. during growth of the crystal. Because such deposition has adverse effects as a foreign material during growth of the crystal that follows, resultant crystal thus obtained has crystallinity properties inappropriate for the use in a light emitting device.

The reaction tube may be cleaned to remove the deposited material every time a layer is grown, although it is obvious that this involves problems with respect to productivity and stability.

Thus it has been difficult to make a crystal of good crystallinity with good reproducibility without impairing the productivity and stability of the product property, and therefore the resultant crystal thus obtained has crystallinity inappropriate for the use in a light emitting device.

An object of the invention is to provide a method for manufacturing group III–V compound semiconductor crystals capable to produce epitaxial crystals having good crystallinity and surface morphology with good reproducibility without impairing the productivity and stability of the product property.

After intense research the present inventors achieved the invention by finding that the problems described above can be solved by introducing an etching gas into the reaction tube before starting the growth of the group III–V compound semiconductor crystal and carrying out gas-phase etching of the substrate and the reaction tube, which is immediately followed by the crystal growth.

The present invention relates to a method for manufacturing group III–V compound semiconductors including at least Ga as the group III element and at least N as the group V element by using metal-organic compounds of group III elements having at least Ga in the molecules thereof and compounds having at least N in the molecules thereof as the raw materials, the group III–V compound semiconductor crystals being grown in a reaction tube, and an epitaxial layer of crystals being grown on a substrate made of a material different from that of the crystals to be grown, wherein at least one kind of gas, selected from a group consisting of compounds including halogen elements and group V elements and hydrogen halide, is introduced before the growth of the compound semiconductor crystal begins, thereby to carry out gas-phase etching of the inner wall surface of the reaction tube.

Also, the present invention relates to a method for manufacturing group III–V compound semiconductors including at least Ga as the group III element and at least N as the group V element by using metal-organic compounds of group III elements having at least Ga in the molecules thereof and compounds having at least N in the molecules thereof as the raw materials, the group III–V compound semiconductor crystals being grown in a reaction tube, and an epitaxial layer of crystals being grown on a buffer layer which is grown on a substrate made of a material different from that of the crystals to be grown, wherein at least one kind of gas, selected from a group consisting of compounds including halogen elements and group V elements and hydrogen halide, is introduced before the growth of the compound semiconductor crystal begins, thereby to carry out gas-phase etching of the inner wall surface of the reaction tube.

As the group III–V compound semiconductor crystal of the invention including at least Ga as the group III element and at least N as the group V element, a group III–V compound semiconductor crystal which is a lamination of at least two layers of GaN, $Ga_xAl_{1-x}N$ ($0<x<1$), $Ga_xIn_{1-x}N$ ($0<x<1$), $Ga_xAl_yIn_{1-x-y}N$ ($0<x<1$, $0<y<1$, $0<x+y<1$), $GaN_yP_{1-y}$ ($0<y<1$) or $GaN_yAs_{1-y}$ ($0<y<1$), or the compound semiconductor made from any of these materials may be used.

In the method for manufacturing the group III–V compound semiconductor crystals of the invention, a metal-organic compound of a group III element having at least Ga in the molecule thereof and a compound having N in the molecule thereof are used as the raw materials.

As the metal-organic compound of a group III element of the invention, trimethylgallium, triethylgallium, diethylgallium azide, trimethylamine gallane, diethylgallium chloride, trineopentylgallium, trimethylaluminum, triethylaluminum, trimethylamine alane, tri-isobutylaluminum, dimethylaluminum hydride, dimethylaluminum chloride, trimethylindium, triethylindium, ethyldimethylindium and tri-isopropylindium may be used. Preferable among these compounds are trimethylgallium, triethylgallium, trimethylaluminum, triethylaluminum, trimethylindium and triethylindium.

As the compound having nitrogen atom in the molecule thereof of the invention, ammonia, hydrazine, methylhydrazine, 1,1-dimethylhydrazine, 1,2-dimethylhydrazine, t-butylamine and ethylenediamine may be used.

The method for manufacturing the group III–V compound semiconductor crystals of the invention is a gas-phase growth method wherein the group III–V compound semiconductor crystal is made to grow in a reaction tube and to be deposited on a substrate made of a material different from the compound semiconductor crystal to be grown. As the substrate made of a material different from the compound semiconductor crystal to be grown of the invention, α-alumina substrate, silicon carbide substrate or silicon substrate may be used. To obtain a substrate of a good quality, α-alumina substrate and silicon substrate are preferable and, to have less lattice mismatch, α-alumina substrate is preferable.

In the method for manufacturing the group III–V compound semiconductor crystal of the invention, at least one kind of gas, selected from a group consisting of compounds, which include halogen elements and group V elements, and hydrogen halide, is introduced before the growth of the compound semiconductor crystal begins, thereby to carry out gas-phase etching of the inner wall of the reaction tube or the inner wall of the reaction tube and the substrate.

As the compound including halogen element and group V element of the invention, arsenide trichloride and phosphor trichloride may be used. As the hydrogen halide, hydrogen chloride, hydrogen bromide and hydrogen iodide may be used. Among these gases, hydrogen chloride is preferable.

The compound including halogen element and group V element of the invention decomposes the group III–V compound semiconductor deposited on the inner wall of the reaction tube or a product of decomposition thereof at a high temperature, and therefore is considered to have desirable etching effect. In this way, after carrying out gas-phase etching of the inner wall of the reaction tube, crystal can be grown with the substrate being mounted on the susceptor.

The compound including halogen element and group V element of the invention is considered to have desirable etching effect even when etching is carried out while the substrate is mounted on a susceptor, because the compound has low tendency to react with α-alumina, silicon carbide or silicon. Therefore it is preferable to carry out gas-phase etching of the inner wall surface of the reaction tube and the substrate, as it improves the productivity.

The inner wall of the reaction tube to be subjected to gas-phase etching in the invention is not necessarily the entire inner wall of the reaction tube, but means the susceptor surface whereon the substrate is mounted and the inner wall of the reaction tube surrounding thereof and the inner wall of the reaction tube in the upstream of the gas flow. More specifically, in case a blow pipe or the like is installed in the upstream of the substrate in order to guide the gas flow onto the substrate, these surfaces are also meant.

Concerning the etching in the invention, it is preferable to etch the substrate together with the inner wall of the reaction tube.

As the buffer layer in the invention, a layer of one of the material selected from a group consisting of $Ga_zAl_{1-z}N$ ($0 \leq z \leq 1$) and ZnO may be used.

Buffer layer made of $Ga_zAl_{1-z}N$ may be manufactured by one of known growth methods. Preferable growth temperature range of the buffer layer is from 300° to 800° C., more preferably from 400° to 700° C., and especially preferably from 500° to 650° C. In the case where the growth temperature of the buffer layer is lower than 300° C., growth rate of the buffer layer is unpractically small, and in the case higher than 800° C., effect of the buffer layer is not enough. Preferable thickness range of the buffer layer is from 100 to 1000 Å, more preferably from 200 to 800 Å. Thickness of the buffer layer smaller than 100 Å is not preferable because the effect of the buffer layer is not clear enough, and that of larger than 1000 Å is not preferable because the effect of buffer layer is almost lost.

One example of manufacturing method of ZnO buffer layer is MOCVD of ZnO on α-alumina substrate. As raw materials of this method, metal-organic compounds suc as diethylzinc [$(C_2H_5)_2Zn$], and oxygen containing compounds such as vapor of water, carbon dioxide gas and $N_2O$, may be used. Preferable growth temperature range of the buffer layer is from 400° to 800° C., and preferable thickness range of the buffer layer is from 50 Å to 3 μm.

The method for manufacturing the group III–V compound semiconductor crystal of tile invention will be described more specifically below.

After setting the substrate made of a material, different from the compound semiconductor film to be grown, such as α-alumina, silicon carbide or silicon in the reaction tube, a carrier gas such as hydrogen is made to flow and, while being heated, at least one kind of gas, selected from a group consisting of compounds including halogen elements and group V elements and hydrogen halide, is introduced. Deposit decomposed by the gas is discharged together with the carrier gas. By growing the crystal thereafter, deterioration of the crystallinty due to the deposited material can be prevented and good single crystal can be obtained.

The method for manufacturing the group III–V compound semiconductor crystal of the invention will be exemplified more specifically below.

1. Etching

A cleaned substrate set in a reaction tube is heated to 1000° to 1200° C. in a hydrogen gas flow, and then, hydrogen chloride gas is introduced to etch the substrate and the inner wall of the reaction tube. After the etching, supply of hydrogen chloride gas is stopped and the substrate is further kept for 5 to 10 minutes.

2. Growth of buffer layer

Substrate temperature is decreased to 500° to 600° C., and ammonia and trimethylgallium (may be denoted as TMG hereafter) are supplied to form a GaN buffer layer 300 to 500 Å thick.

3. Heating

Supply of TMG is stopped and the temperature is increased to the growth temperature (800° to 1200° C.), 4. Bulk growth TMG is supplied to form a GaN layer about 3 μm thick.

5. Cooling

Supply of TMG and heating of the substrate are stopped and, when the substrate has cooled down to about 600° C., supply of ammonia is stopped.

According to the method for manufacturing compound semiconductor crystals of the invention, an epitaxial crystal layer having good crystallinity and surface morphology can be obtained with good reproducibility without impairing the productivity and stability of the product property compared to the prior art, by removing materials deposited on the inner wall of a reaction tube through gas phase etching of the inner wall with or without a substrate. The group III–V compound semiconductor crystal including at least Ga as the group III element and at least N as the group V element obtained by the method for manufacturing compound semiconductor crystal of the invention can be used as a good material for manufacturing light emitting element.

Now the preferred embodiments of the invention will be described below, although the scope of the invention is not limited to these embodiments.

EMBODIMENT 1

With a substrate of α-alumina single crystal being mounted on a carbon susceptor, temperature was controlled by high-frequency induction heating by means of a coil wound around the reaction tube on the outside thereof.

A process of growing gallium nitride compound semiconductor crystal will be described below.

1. With an α-alumina substrate [(0001) plane]which has been cleaned being set on the reaction tube susceptor, atmosphere in the reaction tube was pumped to be vacuum and substituted by hydrogen.

2. While supplying hydrogen from a gas introducing pipe 1 at a rate of 2 liters/minute, the substrate was heated to 1100° C. by high-frequency induction heating.

3. Hydrogen chloride gas diluted with hydrogen to 10% was introduced from a gas introducing pipe 2 at a rate of 100ml/minute.

4. This state was maintained for 5, 10, 15 or 20 minutes, to remove the material deposited on the reaction tube and others through a gas-phase reaction.

5. Supply of hydrogen chloride gas from the gas introducing pipe 2 was stopped and the α-alumina substrate was kept in hydrogen atmosphere for 5 minutes to modify the surface thereof.

6. Substrate temperature was decreased to 600° C. and, in addition to hydrogen gas supplied at a rate of 2 liters/minute, 2 liters/minute of ammonia gas and $7\times10^{-6}$ mol/minute trimethylgallium gas were supplied from the gas introducing pipe 1, to form a GaN buffer layer having a film thickness of about 500 Å.

7. Supply of only the TMG gas was stopped and the substrate temperature was increased to 1100° C.

8. $4.5\times10^{-5}$ mol/minute of trimethylgallium gas was supplied from the gas introducing pipe 1 to grow a GaN epitaxial layer having a film thickness of 3 μm.

Figure 1:
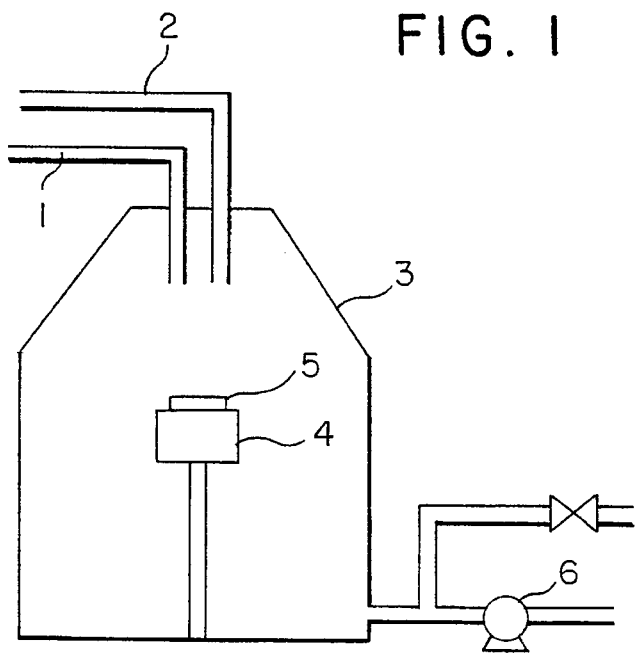
FIG. 1 is a schematic drawing illustrative of an apparatus used in the method for manufacturing the group III–V compound semiconductor crystals of the invention. In the drawing, numeral 1 denotes a first gas introducing pipe, numeral 2 denotes a second gas introducing pipe 2, numeral 3 denotes a reaction tube, numeral 4 denotes a susceptor, numeral 5 denotes a substrate and numeral 6 denotes a vacuum pump.
Figure 2:
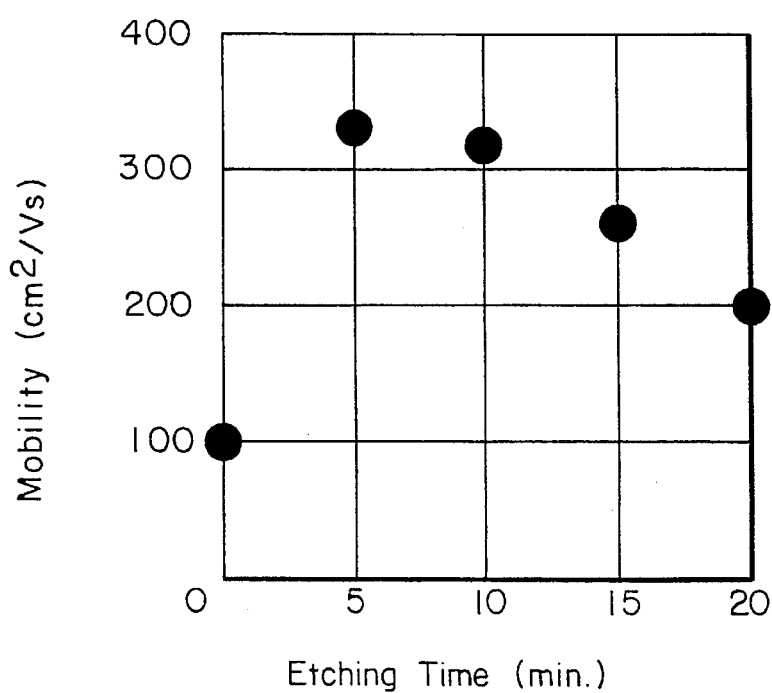
FIG. 2 is a drawing showing the relationship between etching time and mobility of a substrate.

On the GaN crystal obtained by epitaxial growth in the above processes, mobility at the room temperature was evaluated by Hall effect measurement method. The result of evaluation is shown in FIG. 2.

COMPARATIVE EXAMPLE 1

A GaN epitaxial layer was grown similarly to the first embodiment, except for the introduction of the hydrogen chloride gas in the crystal growth process 3 of the first embodiment.

Mobility of the GaN crystal at the room temperature was evaluated by Hall effect measurement method similarly to the first embodiment. The result is shown in FIG. 2 (indicated as etching time 0 minutes).

It can be seen that, in general, better crystallinity can be obtained as the mobility increases in a non-doped growth layer.

In the case of the GaN compound semiconductor crystal obtained according to the invention, mobility higher than 200 cm$^2$ /Vs can be obtained by etching with hydrogen chloride gas and the mobility shows a tendency to decrease as the etching time becomes longer, although it can be seen that the crystallinity is greatly improved in comparison to 100 cm$^2$ /Vs which is obtained when etching by hydrogen chloride gas is not carried out.

With respect to the surface morphology, too, flatness was dramatically improved through heat treatment with hydrogen chloride gas.

EMBODIMENT 2

Crystal was grown in the growth of gallium nitride crystal described in the first embodiment with the processes 3 through 5 being modified as described below.

The α-alumina substrate was kept in hydrogen atmosphere at 1100° C. for 5 minutes, then hydrogen chloride gas diluted to 10% was introduced at a rate of 100ml/minute from the gas introducing pipe 2 and kept in this state for 1 minute. Introduction of hydrogen chloride gas was stopped and kept in the hydrogen atmosphere again for 5 minutes.

Through epitaxial growth in the processes described above, a GaN crystal having good reproducibility, stability and good surface morphology could be obtained.

EMBODIMENT 3

GaN crystal was grown similarly to the crystal growing method of the first embodiment wherein the etching time by hydrogen chloride gas was set to 5 minutes, except that trimethylaluminum was used instead of the TMG as the buffer layer to grow AlN buffer layer. As a result, a crystal having good crystallinity and surface morphology was obtained.

EMBODIMENT 4

In the gallium nitride crystal growing process of the first or second embodiment, a crystal having good crystallinity and surface morphology can be obtained when silicon carbide is used for the substrate.

EMBODIMENT 5

In the gallium nitride crystal growing process of the first or second embodiment, a crystal having good crystallinity and surface morphology can be obtained when silicon is used for the substrate.

What is claimed is:

1. A method for manufacturing group III–V compound semiconductor crystals including at least Ga as the group III element and at least N as the group V element by using metal-organic compounds of a group III metal having at least Ga in the molecule thereof and compounds having N in the molecule thereof as the raw materials, to grow a group III–V compound semiconductor crystal in a reaction tube and grow the crystal on a substrate made of a material different from the group III–V compound semiconductor crystal to be grown;

wherein at least one kind of gas, selected from a group consisting of compounds including halogen elements and group V elements, and hydrogen halide, is introduced before the growth of the compound semiconductor crystal begins thereby to carry out gas phase etching of the inner wall surface of the reaction tube.

2. A method for manufacturing group III–V compound semiconductor crystals including at least Ga as the group III element and at least N as the group V element by using metal-organic compounds of a group III metal having at least Ga in the molecule thereof and compounds having N in the molecule thereof as the raw materials, to grow a group III–V compound semiconductor crystal in a reaction tube and grow the crystal on a buffer layer which is grown on a substrate made of a material different from the group III–V compound semiconductor crystal to be grown;

wherein at least one kind of gas, selected from a group consisting of compounds including halogen elements and group V elements, and hydrogen halide, is introduced before the growth of the compound semiconductor crystal begins thereby to carry out gas phase etching of the inner wall surface of the reaction tube.

3. The method for manufacturing group III–V compound semiconductor crystals as claimed in claim 2, wherein the buffer layer is selected from a group consisting of $Ga_zAl_{1-z}N$ ($0 \leq z \leq 1$) and ZnO.

4. The method for manufacturing group III–V compound semiconductor crystals as claimed in claim 1, wherein the gas phase etching is applied to a substrate in addition to the reaction tube.

5. The method for manufacturing group III–V compound semiconductor crystals as claimed in claim 2, wherein the gas phase etching is applied to a substrate in addition to the reaction tube.

6. The method for manufacturing group III–V compound semiconductor crystals as claimed in claim 1 or 2, wherein the group III–V compound semiconductor is GaN, $Ga_xAl_{1-x}N$ ($0<x<1$), $Ga_xIn_{1-x}N$ ($0<x<1$), $Ga_xAl_yIn_{1-x-y}N$ ($0<x<1$, $0<y<1$, $0<x+y<1$), $GaN_yP_{1-y}$ ($0<y<1$) or $GaN_yAs_{1-y}$ ($0<y<1$), or a lamination of at least two layers of a compound semiconductor made of the aforesaid materials.

7. The method for manufacturing group III–V compound semiconductor crystals as claimed in claim 1, 2, 3, 4 or 5 wherein an α-alumina substrate is used as the substrate.

8. The method for manufacturing group III–V compound semiconductor crystals as claimed in claim 1, 2, 3, 4 or 5 wherein a silicon carbide substrate is used as the substrate.

9. The method for manufacturing group III–V compound semiconductor crystals as claimed in claim 1, 2, 3, 4 or 5 wherein a silicon substrate is used as the substrate.

10. The method for manufacturing group III–V compound semiconductor crystals as claimed in claim 1, 2, 3, 4 or 5 wherein the hydrogen halide is hydrogen chloride.

* * * * *